US008866705B2

(12) United States Patent
Takasugi et al.

(10) Patent No.: US 8,866,705 B2
(45) Date of Patent: Oct. 21, 2014

(54) VOLTAGE COMPENSATION TYPE PIXEL CIRCUIT OF ACTIVE MATRIX ORGANIC LIGHT EMITTING DIODE DISPLAY DEVICE

(71) Applicant: LG Display Co., Ltd., Seoul (KR)

(72) Inventors: Shinji Takasugi, Paju-si (KR); Taro Hasumi, Seoul (KR); Ryosuke Tani, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 37 days.

(21) Appl. No.: 13/889,903

(22) Filed: May 8, 2013

(65) Prior Publication Data

US 2013/0241916 A1 Sep. 19, 2013

Related U.S. Application Data

(62) Division of application No. 13/110,593, filed on May 18, 2011, now Pat. No. 8,462,086.

(30) Foreign Application Priority Data

May 18, 2010 (KR) ........................ 10-2010-0046610

(51) Int. Cl.
*G09G 3/30* (2006.01)
*G09G 3/32* (2006.01)

(52) U.S. Cl.
CPC ...... *G09G 3/3291* (2013.01); *G09G 2300/0861* (2013.01); *G09G 2310/0251* (2013.01); *G09G 3/3233* (2013.01)
USPC .................................. 345/78; 345/76; 345/82

(58) Field of Classification Search
None
See application file for complete search history.

(56) References Cited

U.S. PATENT DOCUMENTS 7,564,433 B2 * 7/2009 Hector et al. .................... 345/82
8,284,136 B2 * 10/2012 Kang et al. ...................... 345/82

(Continued)

FOREIGN PATENT DOCUMENTS

CN 101563720 A 10/2009
JP 2007-179042 7/2007

(Continued)

OTHER PUBLICATIONS

Office Action issued in corresponding Chinese Patent Application No. 201110130240.X, mailed May 31, 2013, 10 pages.

(Continued)

*Primary Examiner* — Joseph Haley
(74) *Attorney, Agent, or Firm* — Brinks Gilson & Lione

(57) ABSTRACT

A voltage compensation type pixel circuit of an AMOLED display device includes a driving transistor serially connected to a light emitting element between high-potential and low-potential power lines to drive the light emitting element in response to a voltage supplied to a first node, a first program transistor for supplying a data voltage of a data line to a second node in response to a scan signal of a scan line, a second program transistor for supplying a reference voltage from a reference voltage supply line to the first node in response to the scan signal of the scan line, a merge transistor for connecting the first and second nodes in response to a merge signal of a merge line, a storage capacitor connected between a third node and the second node interposed between the driving transistor and the light emitting element to store a voltage which corresponds to the data voltage in which the threshold voltage is compensated, and first and second reset transistors for initializing at least two of the first, second, and third nodes to an initialization voltage of an initialization voltage line in response to a reset signal of a reset line.

7 Claims, 13 Drawing Sheets

(56) References Cited

U.S. PATENT DOCUMENTS

| | | | |
|---|---|---|---|
| 2008/0088546 A1* | 4/2008 | Takasugi et al. | 345/76 |
| 2008/0224965 A1 | 9/2008 | Kim | |
| 2009/0135112 A1* | 5/2009 | Uchino et al. | 345/76 |

FOREIGN PATENT DOCUMENTS

| | | |
|---|---|---|
| JP | 2008-176287 | 7/2008 |
| JP | 2010-128491 | 6/2010 |

OTHER PUBLICATIONS

Search Report issued in corresponding Chinese Patent Application No. 201110130240.X, mailed May 31, 2013, 2 pages.

Office Action issued corresponding Japanese Patent Application No. 2011-098648, mailed Sep. 4, 2012.

* cited by examiner

VOLTAGE COMPENSATION TYPE PIXEL CIRCUIT OF ACTIVE MATRIX ORGANIC LIGHT EMITTING DIODE DISPLAY DEVICE

The present patent document is a divisional of U.S. patent application Ser. No. 13/110,593, filed May 18, 2011, which claims priority to Korean Patent Application No. 10-2010-0046610 filed in Korea on May 18, 2010.

BACKGROUND

1. Field of the Invention

The present disclosure relates to an Active Matrix Organic Light Emitting Diode (AMOLED) display device, and more particularly, to a voltage compensation type pixel circuit of an AMOLED display device, which can compensate for a positive threshold voltage and a negative threshold voltage and enables a driving transistor to always operate in a saturation region.

2. Discussion of the Related Art

An AMOLED display device is a self-emitting device to emit light through an organic light emitting layer by electron-hole recombination. The AMOLED display device has high luminance and a low driving voltage and can have an ultra-slim size, thereby being expected as a next-generation display device.

Each of a plurality of circuits constituting an AMOLED display device includes a light emitting element comprised of an organic light emitting layer between an anode and a cathode, and a pixel circuit for independently driving the light emitting element. The pixel circuit may be classified into a voltage-type pixel circuit and a current-type pixel circuit. Since the voltage-type pixel circuit has a simpler external driving circuit than the current-type pixel circuit and is suitable for a high-speed operation, it is well suited to applications to a pixel circuit for an AMOLED TV etc.

The voltage-type pixel circuit mainly includes a switching Thin Film Transistor (TFT), a capacitor, and a driving TFT. The switching TFT charges a voltage corresponding to a data signal to the capacitor in response to a scan pulse, and the driving TFT controls the amount of current flowing into a light emitting element according to the magnitude of the voltage charged to the capacitor, thereby adjusting luminance of the light emitting element. Generally, luminous intensity of the light emitting element is proportional to the current supplied from the driving TFT.

However, a conventional voltage-type pixel circuit has non-uniform luminance due to non-constant threshold voltages Vth of driving TFTs according to position because of deviation in a manufacturing process etc. or has a short lifetime due to a reduction of luminance by varied threshold voltages over time. To solve such a problem, the voltage-type pixel circuit uses a method for detecting and compensating for the threshold voltage of the driving TFT.

A conventional voltage compensation type pixel circuit, which is disclosed, for example, in U.S. Pat. No. 7,649,202 (Korean Patent No. 10-0636483), detects, as a threshold voltage of a driving TFT, a source-gate voltage at which a drain-source current becomes sufficiently small by connecting the gate and the drain, and compensates a data voltage by the detected threshold voltage. The conventional voltage compensation type pixel circuit uses a control TFT serially connected between the driving TFT and a light emitting element in order to cut off light emission of the light emitting element upon detecting the threshold voltage. However, the conventional voltage compensation type pixel circuit is problematic as follows.

First, when a pixel circuit using n-type TFTs detects a threshold voltage of a driving TFT of a diode structure, it cannot detect a negative threshold voltage of the driving TFT. Further, a pixel circuit using p-type TFTs cannot detect a positive threshold voltage of the driving TFT. This is because, in the driving TFT of a diode structure in which the gate and the drain thereof are connected to each other, a gate-drain voltage is 0V and thus a minimum or maximum detectable threshold voltage is limited to 0V.

Second, since the light emitting control TFT serially connected between the driving TFT and the light emitting element always operates in a linear region during light emission, it is greatly affected by bias stress and is greatly subjected to degradation. Generally, if a value obtained by subtracting a threshold value Vth from a gate-source voltage Vgs of a TFT is equal to or less than a drain-source voltage Vds of the TFT (i.e. Vgs−Vth≤Vds), then the TFT is in a saturation region, and if a value obtained by subtracting the threshold value Vth from the gate-source voltage Vgs of the TFT is greater than or equal to the drain-source voltage Vds of the TFT (i.e. Vgs−Vth≥Vds), then the TFT is in a linear region. It is known that TFT degradation progresses rapidly in the linear region. However, in the conventional voltage compensation type pixel circuit, the light emitting control TFT operates in the linear region and the driving TFT operates in the saturation region, during a light emitting period. Accordingly, the light emitting control TFT is subjected to degradation faster than the driving TFT due to bias stress.

Meanwhile, if the light emitting control TFT is omitted in order to solve such a problem thereof, since the light emitting element emits light even during a non-light emitting period, black luminance is increased and thus contrast is lowered.

As a known prior art document related to the invention of the present application, for example, we note Korean Patent No. 10-0636483 (U.S. Pat. No. 7,649,202).

BRIEF SUMMARY

A voltage compensation type pixel circuit of an organic light emitting diode for driving a light emitting element includes a driving transistor serially connected to the light emitting element between a high-potential power line and a low-potential power line to drive the light emitting element in response to a voltage supplied to a first node, a first program transistor for supplying a data voltage of a data line to a second node in response to a scan signal of a scan line, a second program transistor for supplying a reference voltage from a reference voltage supply line to the first node in response to the scan signal of the scan line, a merge transistor for connecting the first node and the second node in response to a merge signal of a merge line, a storage capacitor connected between a third node and the second node to store a voltage which corresponds to the data voltage in which the threshold voltage is compensated, wherein the third and second nodes are interposed between the driving transistor and the light emitting element, and first and second reset transistors for initializing at least two of the first, second, and third nodes to an initialization voltage of an initialization voltage line in response to a reset signal of a reset line.

In another aspect of the present disclosure, a voltage compensation type pixel circuit of an organic light emitting diode for driving a light emitting element includes a driving transistor serially connected to the light emitting element between a high-potential power line and a low-potential power line to drive the light emitting element in response to a voltage supplied to a first node, a program transistor for supplying a data voltage of a data line to a second node in response to a scan signal of a scan line, a merge transistor for connecting the first node and the second node in response to a merge signal of a merge line, a storage capacitor connected between a third node and the second node to store a voltage which corresponds to the data voltage in which the threshold voltage is compensated, wherein the third and second nodes are interposed between the driving transistor and the light emitting element, first and second reset transistors for initializing at least two of the first, second, and third nodes to an initialization voltage of an initialization voltage line in response to a reset signal of a reset line, and a capacitor connected between the scan line and the first node to supply a reference voltage to the first node according to variation of the scan signal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE DRAWINGS AND THE PRESENTLY PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
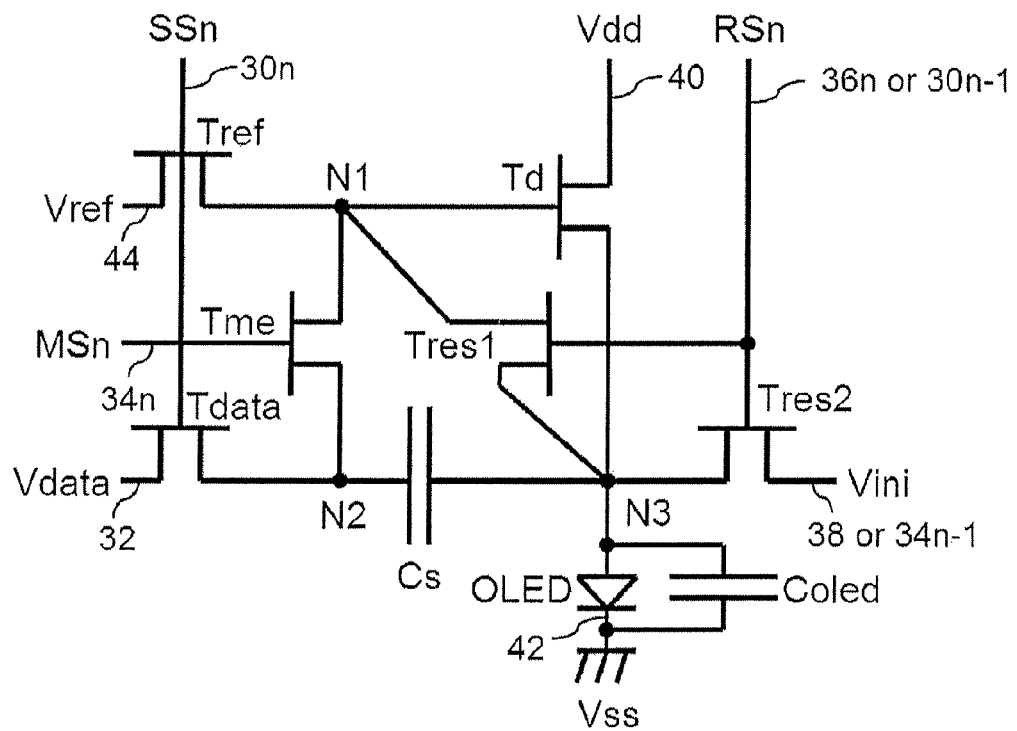
FIG. 1 is an equivalent circuit diagram of a pixel circuit of an AMOLED display device according to a first exemplary embodiment of the present invention.
Figure 2:
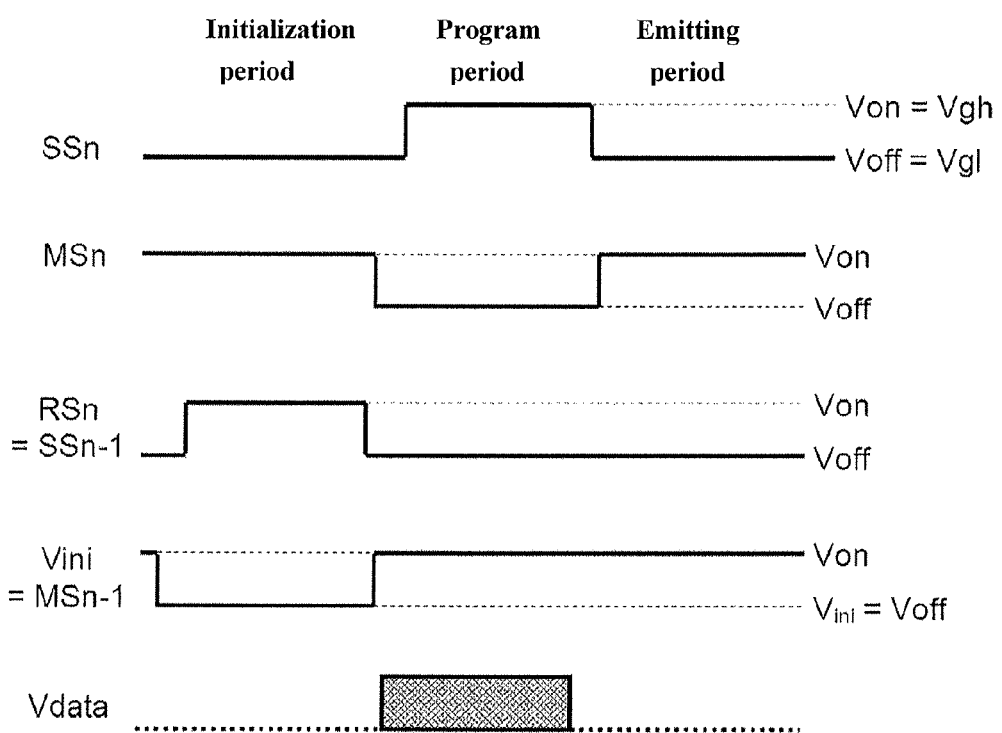
FIG. 2 is a driving waveform chart of the pixel circuit of FIG. 1.

FIG. 1 is an equivalent circuit diagram of a pixel circuit of an AMOLED display device according to a first exemplary embodiment of the present invention, and FIG. 2 is a driving waveform chart of the pixel circuit of FIG. 1.

The pixel circuit of FIG. 1 drives an OLED to generate luminance corresponding to a data voltage Vdata and includes 6 n-type TFTs and one storage capacitor Cs. A plurality of pixel circuits constitutes the AMOLED display device and each pixel circuit independently drives each OLED.

The OLED is serially connected to a driving TFT Td between a high-potential power line 40 and a low-potential power line 42. The OLED has an anode connected to the driving TFT Td, a cathode connected to the low-potential power line 42, and a light emitting layer between the cathode and the anode. The light emitting layer includes an electron injection layer, an electron transport layer, an organic light emitting layer, a hole transport layer, and a hole injection layer which are sequentially deposited between the cathode and the anode thereof. If a positive bias is supplied between the anode and cathode of the OLED, electrons are supplied from the cathode to the organic light emitting layer via the electron injection layer and the electron transport layer, and holes are supplied from the anode to the organic light emitting layer via the hole injection layer and the hole transport layer. The organic light emitting layer generates luminance proportional to current density by emitting light through a fluorescent or phosphorescent material by recombination of the supplied electrons and holes. Meanwhile, if a negative bias is supplied to the OLED, the OLED serves as a capacitor Coled for accumulating charges.

The pixel circuit includes 6 n-type TFTs including one driving TFT Td, two reset TFTs Tres1 and Tres2, two program TFTs (i.e. one reference TFT Tref and one data TFT Tdata), and one merge TFT Tme for initializing light emission and includes one storage capacitor Cs connected between the OLED and the data TFT Tdata.

The pixel circuit also includes three control lines, including an n-th (where n is a positive integer) scan line 30$n$ for supplying an n-th scan signal SSn, an n-th merge line 34$n$ for supplying an n-th merge signal MSn, and an n-th reset line 36$n$ for supplying an n-th reset signal RSn. The n-th reset line 36$n$ may be replaced with an (n−1)-th scan line 30$n$−1 which is a previous stage scan line of the n-th scan line 30$n$. The n-th merge signal MSn has polarity opposite to the n-th scan signal SSn.

The pixel circuit includes three fixed power lines, including the high-potential power line 40 for supplying a high potential voltage Vdd, the low-potential power line 42 for supplying a low potential voltage Vss lower than the high potential voltage Vdd, and a reference voltage line 44 for supplying a reference voltage Vref which is lower than the high potential voltage Vdd and is higher than or equal to the low potential voltage Vss. The reference voltage Vref may be replaced with the low potential voltage Vss.

The pixel circuit also includes a data line 32 for supplying the data voltage Vdata and an initialization line 38 for supplying an initialization voltage Vini. Since the initialization voltage Vini does not need to be a fixed voltage, the initialization line 38 may be replaced with an (n−1)-th merge line 34$n$−1 which is a previous stage merge line. The initialization voltage Vini uses a voltage lower than the low potential voltage Vss, for example, a gate-off voltage Voff supplied to the (n−1)-th merge line 34$n$−1.

The reference TFT Tref has a gate electrode connected to the n-th scan line 30n, a first electrode connected to the reference voltage line 44, and a second electrode connected to a first node N1 which is connected to a gate electrode of the driving TFT Td. The first electrode and second electrode of the reference TFT Tref correspond to a source electrode or a drain electrode according to current direction. The reference TFT Tref supplies the reference voltage Vref to the first node N1 during a program period in response to the scan signal SSn from the n-th scan line 30n.

The data TFT Tdata has a gate electrode connected to the n-th scan line 30n, a first electrode connected to the data line 32, and a second electrode connected to a second node N2 which is connected to the storage capacitor Cs. The first electrode and second electrode of the data TFT Tdata correspond to a source electrode or a drain electrode according to current direction. The data TFT Tdata supplies the data voltage Vdata to the second node N2 during a program period in response to the scan signal SSn from the n-th scan line 30n.

The merge TFT Tme has a gate electrode connected to the n-th merge line 34n, a first electrode connected to the first node N1, and a second electrode connected to the second node N2. The first electrode and second electrode of the merge TFT Tme correspond to a source electrode or a drain electrode according to current direction. The merge TFT Tme connects the first node N1 and the second node N2 during an initialization period and a light emitting period in response to the merge signal MSn from the n-th merge line 34n.

The first reset TFT Tres1 has a gate electrode connected to the n-th reset line 36n, a first electrode connected to a third node N3 which is connected to the anode of the OLED, and a second electrode connected to the first node N1.

The second reset TFT Tres2 has a gate electrode connected to the n-th reset line 36n, a first electrode connected to the initialization line 38, and a second electrode connected to the third node N3. The first electrodes and second electrodes of the first and second reset TFTs Tres1 and Tres2 correspond to source electrodes or drain electrodes according to current direction. The first and second reset TFTs Tres1 and Tres2 initialize the nodes N1, N2, and N3 to the initialization voltage Vini during an initialization period in response to the reset signal RSn of the n-th reset line 36n. Using the (n−1)-th scan line 30n−1 as the n-th reset line 36n, the first and second reset TFTs Tres1 and Tres2 may be switched in response to a scan signal SSn−1 of the (n−1)-th scan line 30n−1 during the initialization period. Using the (n−1)-th merge line 34n−1 as the initialization line 38, the gate-off voltage Voff of a merge signal MSn-supplied to the (n−1)-th merge line 34n−1 may be supplied as the initialization voltage Vini during the initialization period.

The driving TFT Td has a gate electrode connected to the first node N1, a first electrode connected to the high-potential power line 40, and a second electrode connected to the third node N3 which is connected to the anode of the OLED. The first electrode and second electrode of the driving TFT Td correspond to a source electrode or a drain electrode according to current direction. The driving TFT Td drives the OLED by controlling current flowing into the OLED via the third node N3 from the high-potential power line 40 according to a voltage supplied to the first node N1.

The above-described pixel circuit is sequentially driven through an initialization period, a program period, and a light emitting period, as shown in FIG. 2. During the initialization period, the first, second, and third nodes N1, N2, and N3 are initialized to the initialization voltage Vini by active driving of the first and second reset TFTs Tres1 and Tres2 and the merge TFT Tme. During the program period, a threshold voltage Vth of the driving TFT Td is detected and a voltage corresponding to the data voltage Vdata in which the threshold voltage Vth is compensated is stored in the storage capacitor Cs, by active driving of the reference TFT Tref, the data TFT Tdata, and the driving TFT Td. During the light emitting period, the driving TFT Td drives the OLED to emit light in response to a voltage supplied from the storage capacitor Cs by active driving of the merge TFT Tme and the driving TFT Td.

Figure 3:
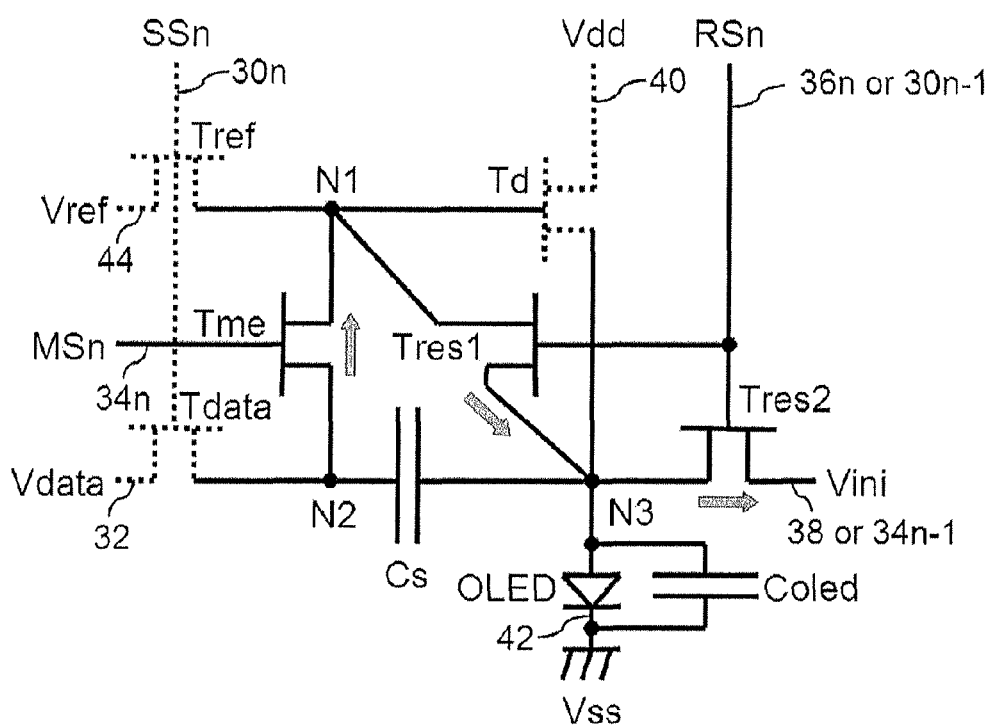
FIG. 3 is an equivalent circuit diagram of the pixel circuit of FIG. 1 illustrating a driving state during an initialization period.
Figure 4:
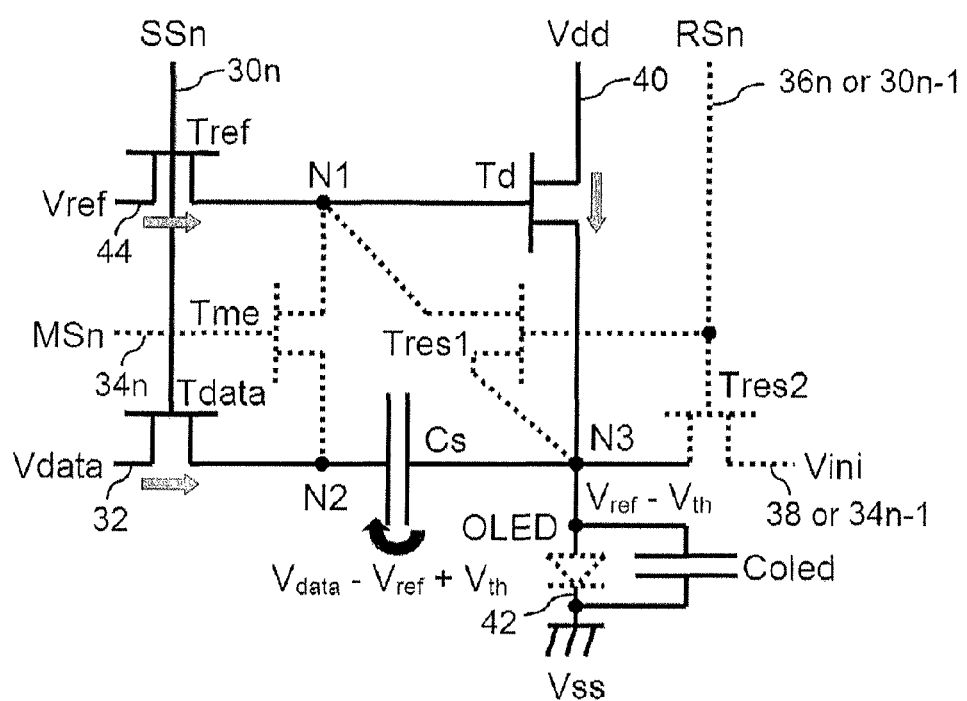
FIG. 4 is an equivalent circuit diagram of the pixel circuit of FIG. 1 illustrating a driving state during a program period.
Figure 5:
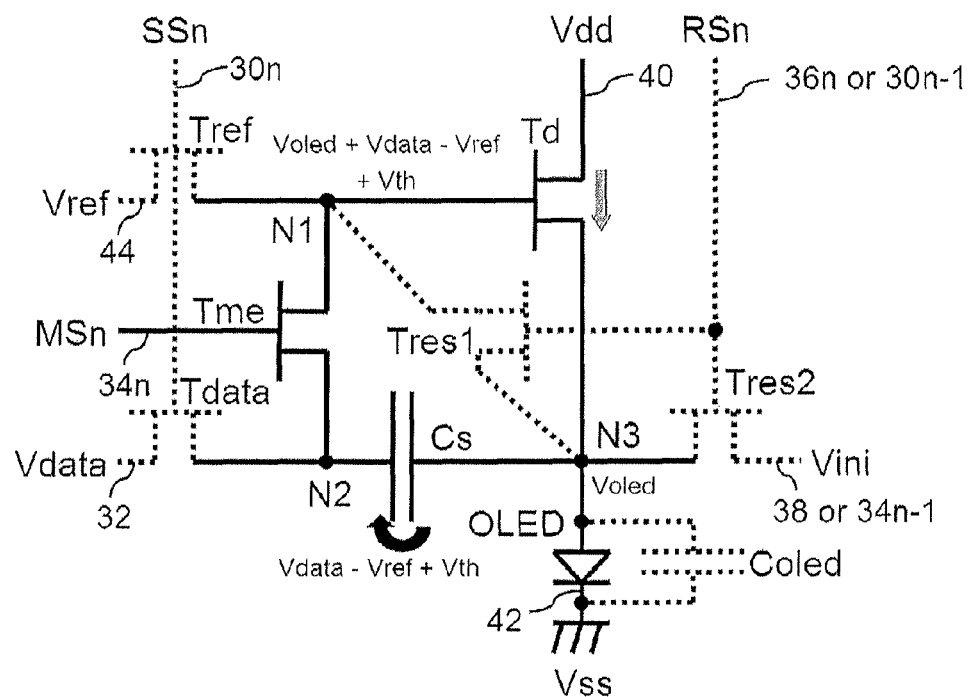
FIG. 5 is an equivalent circuit diagram of the pixel circuit of FIG. 1 illustrating a driving state during a light emitting period.

FIGS. 3, 4, and 5 are equivalent circuit diagrams of the pixel circuit of FIG. 1 illustrating driving states during an initialization period, a program period, and a light emitting period respectively. Hereinafter, operation of the pixel circuit 20 during the initialization period, program period, and light emitting period will be described in detail with reference to FIGS. 2 to 5.

Since the pixel circuit of FIG. 1 is comprised of n-type TFTs, the TFTs are turned on and activated by a gate high voltage Vgh of a high state shown in FIG. 2, that is, a gate-on voltage Von and are turned off by a gate low voltage Vgl of a low state, that is, a gate-off voltage Voff.

During the initialization period shown in FIGS. 2 and 3, the first and second reset TFTs Tres1 and Tres2 and the merge TFT Tme are turned on to initialize the first to third nodes N1, N2, and N3 to the initialization voltage Vini. To this end, the gate-on voltage Von of the reset signal RSn is supplied to the n-th reset line 36n, the gate-on voltage Von of the merge signal MSn is supplied to the n-th merge line 34n, and the gate-off voltage Voff of the scan signal SSn is supplied to the n-th scan line. Then, as shown in FIG. 3, the first reset TFT Tres1, the second reset TFT Tres2, and the merge TFT Tme are turned on in response to the gate-on voltage Von, the reference TFT Tref and the data TFT Tdata are turned off in response to the gate-off voltage Voff, and the driving TFT Td is turned off by the initialization voltage Vini of a low state supplied to the first node N1. Accordingly, the initialization voltage Vini supplied to the initialization line 38 is supplied to the first, second, and third nodes N1, N2, and N3 via the turned-on first reset TFT Tres, second reset TFT Tres2, and merge TFT Tme so that the first, second, and third nodes N1, N2, and N3 are initialized to the same initialization voltage Vini. A voltage of a low state lower than the low potential voltage Vss is supplied as the initialization voltage Vini. For example, the gate-off voltage Voff of the (n−1)-th merge signal MSn−1 may be supplied as the initialization voltage Vini by using the (n−1)-th merge line 34n−1 as the initialization line 38. As a result, during the initialization period, the initialization voltage Vini lower than the low potential voltage Vss is supplied to the third node N3 and thus a negative bias is applied to the OLED. Therefore, the OLED does not emit light and serves as the capacitor Coled for accumulating charges. As the n-th reset line 36n, the (n−1)-th scan line 30n−1 for supplying the scan signal SSn−1 of the gate-on voltage Von during the initialization period may be used.

Meanwhile, during the initialization period, in order to prevent unnecessary light emission of the OLED, an active period of the reset signal RSn during which the gate-on voltage Von is supplied to the reset line 36n is set to be shorter than a period during which the initialization voltage of a low state (Vini=Voff) is supplied as shown in FIG. 2. That is, an active period of the (n−1)-th scan signal SSn−1 during which the gate-on voltage is supplied to the (n−1)-th scan line 30n−1 is set to be shorter than a non-active period within the non-active period of the merge signal MSn−1 during which the gate-off voltage Voff is supplied to the (n−1)-th merge line 34n−1.

During the program period shown in FIGS. 2 and 4, the reference TFT Tref, the data TFT Tdata, and the driving TFT Td are turned on, the threshold voltage Vth of the driving TFT Td is detected by using the OLED as the capacitor Coled, and a voltage corresponding to the data voltage Vdata in which the threshold voltage is compensated is stored in the storage capacitor Cs. To this end, the gate-on voltage of the scan signal SSn is supplied to the n-th scan line 30n, the gate-off voltage Voff of the merge signal MSn is supplied to the n-th merge line 34n, and the gate-off voltage Voff of the reset signal RSn is supplied to the n-th reset line 36n. Then, as shown in FIG. 4, the reference TFT Tref and the data TFT Tdata are turned on in response to the gate-on voltage, the driving TFT Td is turned on until source-drain current becomes sufficiently small by the reference voltage Vref supplied to the first node N1, and the first and second reset TFTs Tres1 and Tres2 and the merge TFT Tme are turned off by the gate-off voltage. If the data voltage Vdata is supplied through the turned-on data TFT Tdata, a voltage of the second node N2 varies to the data voltage Vdata from the initialization voltage (Vini=Voff), and a voltage VN3 of the third node N3 varies as indicated in the following Equation 1 in proportion to a variation (Vdata−Voff) of the voltage of the second node N2.

$$V_{N3} = V_{ini} + (V_{data} - V_{ini})S\left(\frac{c_s}{C_{oled} + c_s}\right) \quad \text{[Equation 1]}$$

Since the voltage VN3 of the third node N3 is lower than the low potential voltage Vss, the OLED serves as the capacitor Coled due to the negative bias applied thereto. The OLED serving as the capacitor Coled accumulates charges through the driving TFT Td until a potential of the third node N3 reaches a value (Vref−Vth) obtained by subtracting the threshold voltage Vth of the driving TFT Td from the reference voltage Vref, that is, until the source-drain current Ids of the driving TFT Td becomes sufficiently small. Then the voltage (Vref−Vth) obtained by subtracting the threshold voltage Vth of the driving TFT Td from the reference voltage Vref, that is, the threshold voltage Vth of the driving TFT Td can be detected in the third node N3. Especially, since the threshold voltage Vth is detected using the OLED as the capacitor without using a diode structure in which the gate and drain of the driving TFT Td are connected, a negative threshold voltage as well as a positive threshold voltage can be accurately detected. As a result, the storage capacitor Cs stores a voltage (Vdata−Vref+Vth) corresponding to a difference between the data voltage Vdata supplied via the turned-on data TFT Tdata and the voltage (Vref−Vth) supplied to the node N3. Namely, the storage capacitor Cs stores the voltage (Vdata−Vref+Vth) corresponding to the data voltage in which the threshold voltage Vth is compensated.

Meanwhile, in FIG. 2, an active period of the scan signal SSn supplied to the n-th scan line 30n is set to be shorter than a non-active period of the merge signal MSn supplied to the n-th merge line 34. The (n−1)-th scan line 30n−1 supplying the scan signal SSn−1 of the gate-off voltage Voff during the program period may be used as the n-th reset line 36n.

During the light emitting period shown in FIGS. 2 and 5, the merge TFT Tme is turned on and the driving TFT Td drives the OLED to emit light in response to a voltage of the storage capacitor Cs. To this end, the gate-on voltage Von of the merge signal MSn is supplied to the n-th merge line 34n, the gate-off voltage Voff of the reset signal RSn is supplied to the n-th reset line 36n, and the gate-off voltage Voff of the scan signal SSn is supplied to the n-th scan line 30n. Then, as shown in FIG. 5, the merge TFT Tm is turned on in response to the gate-on voltage Von to connect the first and second nodes N1 and N2, and the first reset TFT Tres1, the second reset Tres2, the reference TFT Tref and the data TFT Tdata are turned off in response to the gate-off voltage Voff. The driving TFT Td drives the OLED to emit light by controlling the current Ids supplied to the OLED from the high potential voltage line 40 in response to the voltage (Vdata−Vref+Vth) of the storage capacitor Cs supplied to the node N1 via the merge TFT Tme. The OLED emits light in proportion to density of the output current Ids of the driving TFT Td. The current Ids supplied to the OLED through the TFT Td may be indicated by the following Equation 2.

$$I_{ds} = \frac{\beta}{2}S(V_{gs} - V_{th})^2 = \frac{\beta}{2}S[(V_{data} - V_{ref} + V_{th}) - V_{th}]^2 = \frac{\beta}{2}S(V_{data} - V_{ref})^2 \quad \text{[Equation 2]}$$

In Equation 2, β is a proportion coefficient determined by the structure (channel width and length) and physical properties of the driving TFT Td. Referring to Equation 2, since the threshold voltage Vth is offset in a voltage for determining the output current Ids of the driving TFT Td, the output current Ids is not influenced by the threshold voltage Vth of the driving TFT Td. In addition, since the output current Ids is proportional to a voltage Vdata−Vref corresponding to a difference between the data voltage Vdata and the reference voltage Vref, black luminance of the OLED may be controlled by adjusting the reference voltage Vref. During the light emitting period, since the driving TFT Td always operates in a saturation region in which a value obtained by subtracting the threshold voltage Vth from the gate-source voltage Vgs is less than or equal to the drain-source voltage, that is, Vgs−Vth≤Vds, degradation of the driving TFT Td caused by bias stress is very small.

Figure 6:
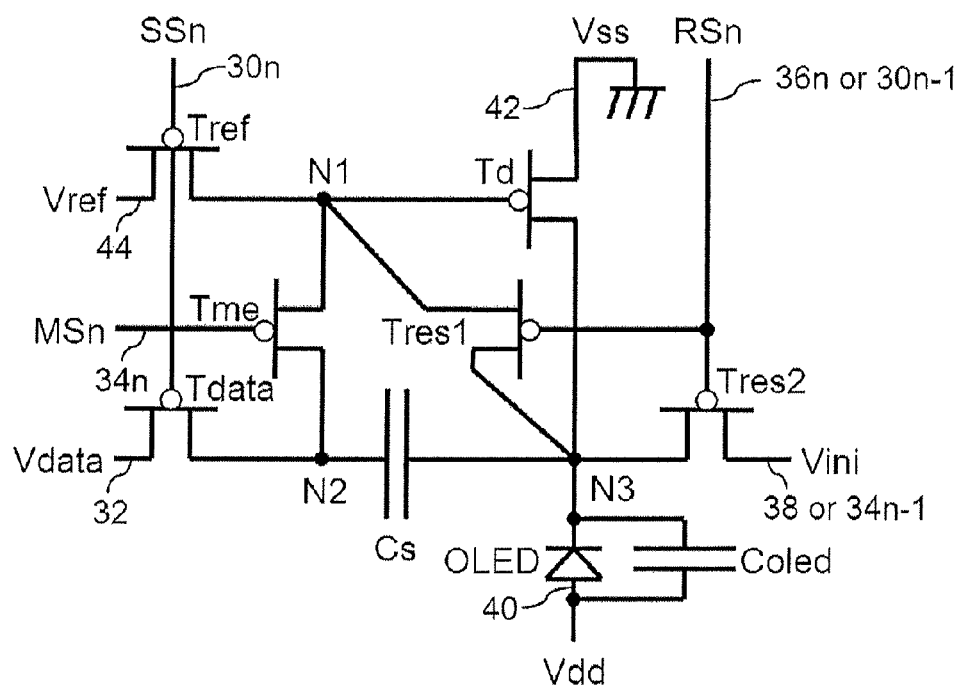
FIG. 6 is an equivalent circuit diagram of the pixel circuit of FIG. 1 to which p-type TFTs are applied.
Figure 7:
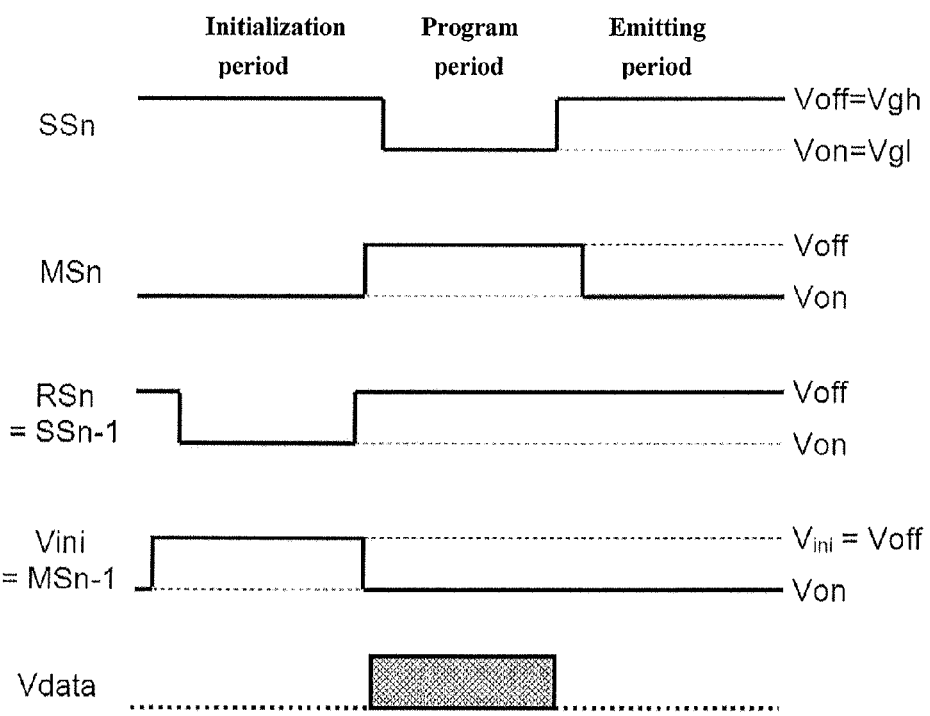
FIG. 7 is a waveform chart illustrating driving of the pixel circuit of FIG. 6.

FIG. 6 is an equivalent circuit diagram of the pixel circuit of FIG. 1 to which p-type TFTs are applied, and FIG. 7 is a waveform chart illustrating driving of the pixel circuit of FIG. 6.

The pixel circuit of FIG. 1 is comprised only of n-type TFTs. However, p-type TFTs may be applied to the pixel circuit as shown in FIG. 6. When comparing the pixel circuit of FIG. 6 with the pixel circuit of FIG. 1, a driving TFT Td, a first reset TFT Tres1 for controlling the driving TFT Td, a second reset TFT Tres2, a merge TFT Tme, a reference TFT Tref, and a data Tdata are comprised of p-type TFTs, an OLED has a reverse connection structure in which an anode thereof is connected to a high-potential power line 40 and a cathode thereof is connected to a third node N3 which is connected to the driving TFT Td, and a source electrode of the driving TFT Td is connected to a low-potential power line 42. Description of parts which are identical to those of FIG. 1 will be omitted.

Since the pixel circuit of FIG. 6 is comprised of P-type TFTs, the driving waveform shown in FIG. 7 has polarity opposite to the driving waveform of the n-type TFTs shown in FIG. 2. That is, in the driving waveform shown in FIG. 7, a gate-low voltage Vgl of a low state is used as a gate-on voltage, and a gate-high voltage Vgh of a high state is used as a gate-off voltage.

During an initialization period shown in FIG. 7, the first reset TFT Tres1, the second reset TFT Tres2, and the merge TFT Tme are turned on in response to the gate-on voltage Von of an n-th reset signal RSn and an n-th merge signals MSn to initialize first, second, and third nodes N1, N2, and N3 to an initialization voltage (Vini=Voff=Vgh>Vss). In this case, the OLED is not driven by a negative bias and, instead, serves as a capacitor Coled.

During a program period shown in FIG. 7, the reference TFT Tref and the data TFT Tdata are turned on in response to the gate-on voltage of an n-th scan signal SSn, and the driving TFT Td is turned on until source-drain current thereof becomes sufficiently small in response to a reference voltage Vref. Therefore, a threshold voltage Vth of the driving TFT Td is detected by using the OLED as the capacitor and a storage capacitor Cs stores a voltage (Vdata−Vref+Vth) corresponding to a data voltage Vdata in which the threshold voltage Vth is compensated. In this case, since the driving TFT is not a diode structure in which a gate and drain thereof are connected, a positive threshold voltage of the p-type driving TFT Td as well as a negative threshold voltage can be accurately detected.

During a light emitting period shown in FIG. 7, the merge TFT Tme is turned on in response to the gate-on voltage Von of the n-th merge signal MSn, and the driving TFT Td drives the OLED to emit light in response to the voltage (Vdata−Vref+Vth) supplied to the node N2 from the storage capacitor Cs through the merge TFT Tme. Since the driving TFT Td operates only in a saturation region, degradation of the driving TFT Td caused by bias stress is very small.

Figure 8:
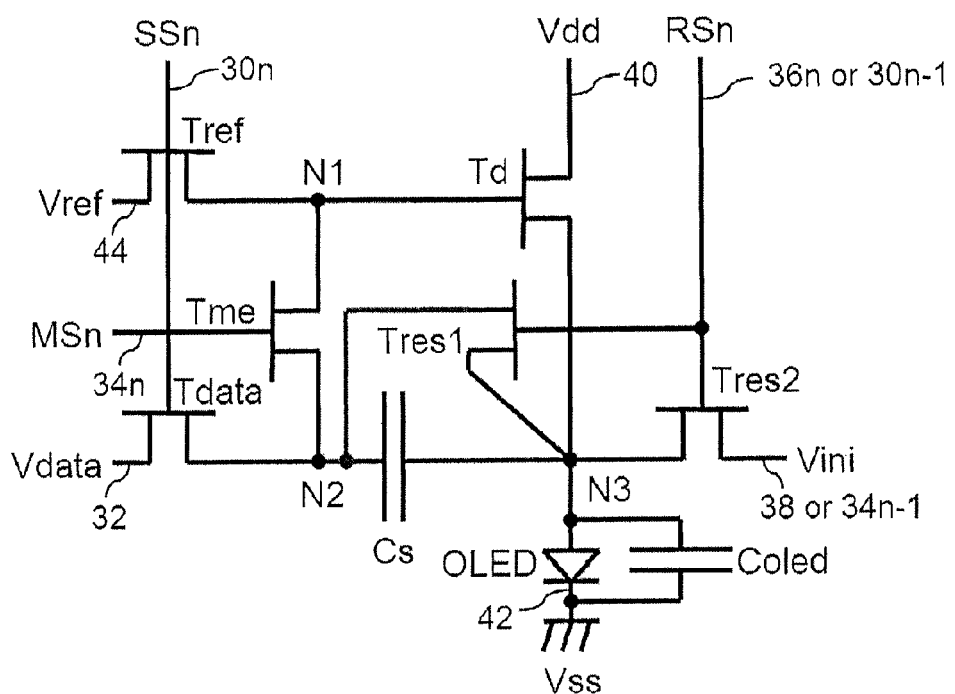
FIG. 8 is an equivalent circuit diagram of a pixel circuit of an AMOLED display device according to a second exemplary embodiment of the present invention.

FIG. 8 is an equivalent circuit diagram of a pixel circuit of an AMOLED display device according to a second exemplary embodiment of the present invention.

The pixel circuit of FIG. 8 according to the second embodiment is the same as the pixel circuit of FIG. 1 according to the first embodiment, except that the second electrode of the first reset TFT Tres1 is connected not to the first node N1 but to the second node N2 and, therefore, description of parts which are identical to those of FIG. 1 will be omitted. In the pixel circuit of FIG. 8, during an initialization period, the first and second reset TFTs Tres1 and Tres2 and the merge TFT Tme are turned on by the gate-on voltage Von of the reset signal RSn and the merge signal MSn to initialize the first, second, and third nodes N1, N2, and N3 to the initialization voltage Vini.

Figure 9:
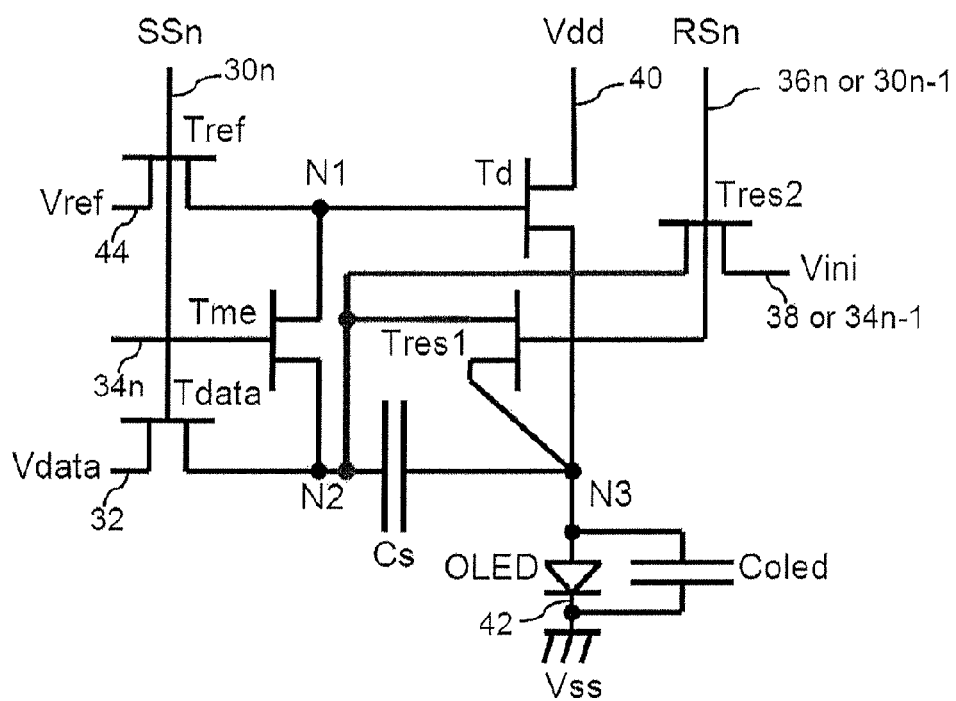
FIG. 9 is an equivalent circuit diagram of a pixel circuit of an AMOLED display device according to a third exemplary embodiment of the present invention.

FIG. 9 is an equivalent circuit diagram of a pixel circuit of an AMOLED display device according to a third exemplary embodiment of the present invention.

The pixel circuit of FIG. 9 according to the third embodiment is the same as the pixel circuit of FIG. 1 according to the first embodiment, except that the second electrode of the first reset TFT Tres1 is connected not to the first node N1 but to the second node N2, and the second electrode of the second reset TFT Tres2 is connected not to the third node N3 but to the second node N2. Therefore, description of parts which are identical to those of FIG. 1 will be omitted. In the pixel circuit of FIG. 9, during an initialization period, the first and second reset TFTs Tres1 and Tres2 and the merge TFT Tme are turned on by the gate-on voltage Von of the reset signal RSn and the merge signal MSn to initialize the first, second, and third nodes N1, N2, and N3 to the initialization voltage Vini.

Figure 10:
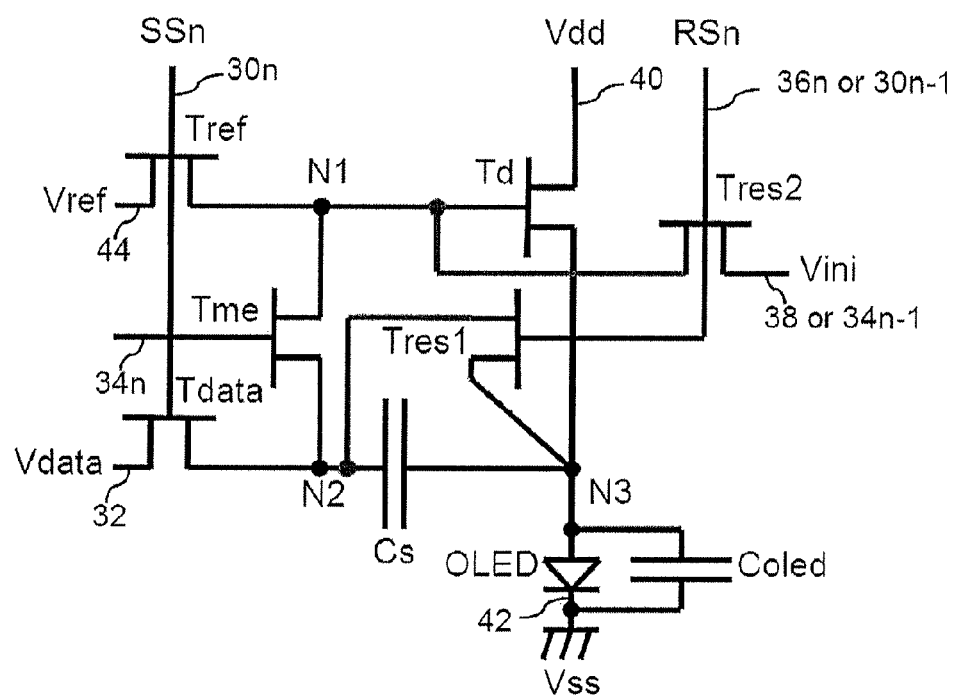
FIG. 10 is an equivalent circuit diagram of a pixel circuit of an AMOLED display device according to a fourth exemplary embodiment of the present invention.

FIG. 10 is an equivalent circuit diagram of a pixel circuit of an AMOLED display device according to a fourth exemplary embodiment of the present invention.

The pixel circuit of FIG. 10 according to the fourth embodiment is the same as the pixel circuit of FIG. 1 according to the first embodiment, except that the second electrode of the first reset TFT Tres1 is connected not to the first node N1 but to the second node N2, and the second electrode of the second reset TFT Tres2 is connected not to the third node N3 but to the first node N1. Therefore, description of parts which are identical to those of FIG. 1 will be omitted. In the pixel circuit of FIG. 10, during an initialization period, the first and second reset TFTs Tres1 and Tres2 and the merge TFT Tme are turned on by the gate-on voltage Von of the reset signal RSn and the merge signal MSn to initialize the first, second, and third nodes N1, N2, and N3 to the initialization voltage Vini.

Figure 11:
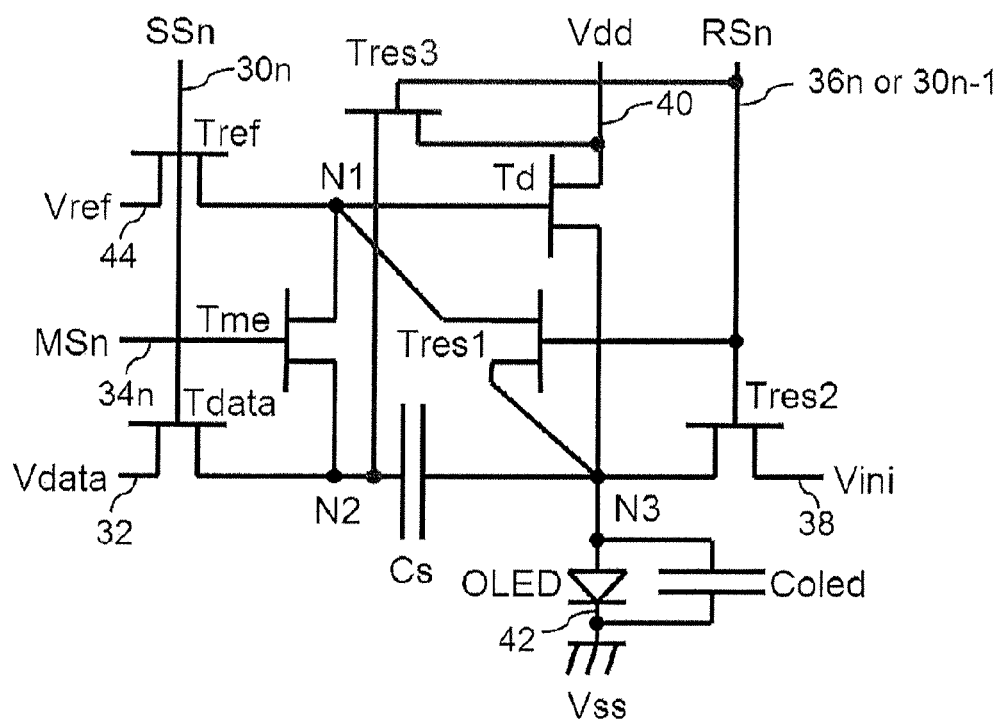
FIG. 11 is an equivalent circuit diagram of a pixel circuit of an AMOLED display device according to a fifth exemplary embodiment of the present invention.
Figure 12:
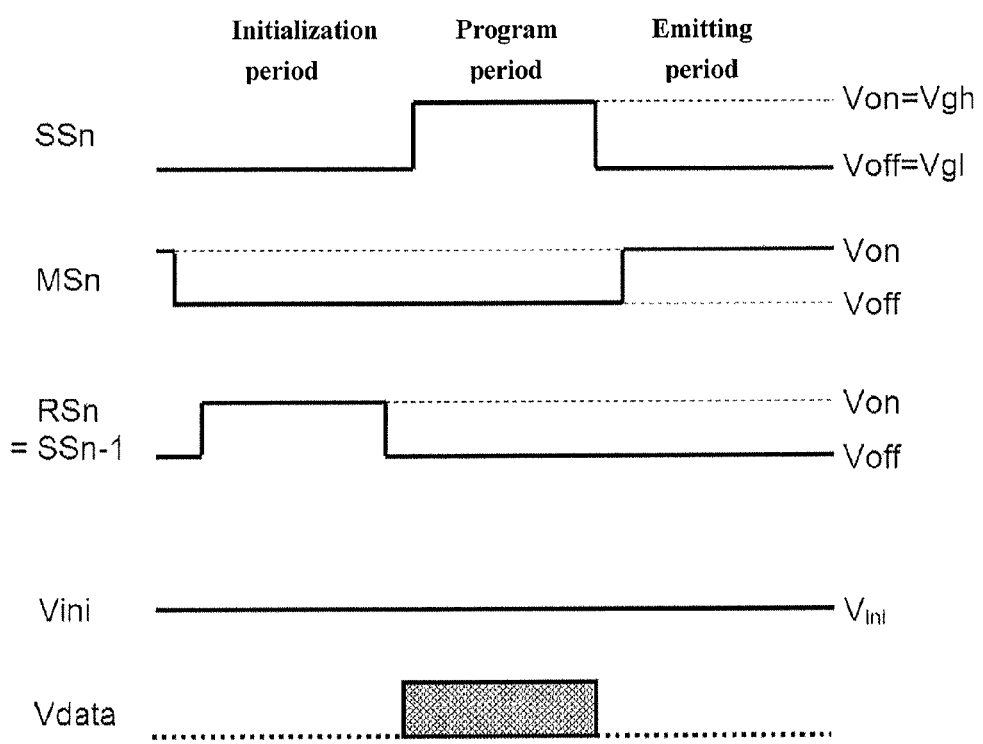
FIG. 12 is a driving waveform chart of the pixel circuit of FIG. 11.

FIG. 11 is an equivalent circuit diagram of a pixel circuit of an AMOLED display device according to a fifth exemplary embodiment of the present invention, and FIG. 12 is a driving waveform chart of the pixel circuit of FIG. 11.

The pixel circuit of FIG. 10 according to the fifth embodiment is the same as the pixel circuit of FIG. 1 according to the first embodiment, except that a third reset TFT Tres3 is additionally included, and therefore, description of parts which are identical to those of FIG. 1 will be omitted. The third reset TFT Tres3 has a gate electrode connected to the n-th reset line 36n, a first electrode connected to the high-potential power line 40, and a second electrode connected to the second node N2. The first electrode and the second electrode of the third reset TFT Tres3 correspond to a source electrode or a drain electrode according to current direction. The third reset TFT Tres3 initializes the second node N2 to the high potential voltage Vdd during an initialization period in response to the reset signal RSn supplied to the n-th reset line 36n or the gate-on voltage Von of the scan signal SSn−1 supplied to the (n−1)-th scan line 30n−1.

When comparing the driving waveforms shown in FIG. 2 with the driving waveforms shown in FIG. 12, the merge signal MSn supplied to the n-th merge line 34n applies the gate-off voltage Voff only during the program period in FIG. 2 while the merge signal MSn supplied to the n-th merge line 34n applies the gate-off voltage Voff during both the initialization period and the program period in FIG. 12. Further, in FIG. 2, the gate-off voltage Voff of the previous stage (n−1)-th merge signal MSn−1 is used as the initialization voltage Vini while in FIG. 12, the initialization voltage Vini is fixed to a DC voltage.

During the initialization period shown in FIG. 12, the first and second reset TFTs Tres1 and Tres2 initialize the first and third nodes N1 and N3 to the initialization voltage Vini in response to the reset signal RSn supplied to the n-th reset line 36n or the gate-on voltage Von of the scan signal SSn−1 supplied to the (n−1)-th scan line 30n−1. The third reset TFT Tres3 initializes the second node N2 to the high potential voltage Vdd. The merge TFT Tme is turned off in response to the gate-off voltage Voff of the merge signal MSn supplied to the n-th merge line 34n.

During the program period shown in FIG. 12, the reference TFT Tref supplies the reference voltage Vref to the first node N1 in response to the gate-on voltage Von of the scan signal SSn supplied to the n-th scan line 30n, and the data TFT Tdata supplies the data voltage Vdata to the second node N2. If the data voltage Vdata is supplied through the turned-on data TFT Tdata, a voltage of the second node N2 varies from the high potential voltage Vdd to the data voltage Vdata, and a voltage of the third node N3 varies in proportion to a variation Vdata−Vdd of the voltage of the second node N2 as indicated by the following Equation 3.

$$V_{N3} = V_{ini} + (V_{data} - V_{dd})S\left(\frac{C_S}{C_{oled} + C_S}\right) \qquad \text{[Equation 3]}$$

In this case, since the voltage VN3 of the third node N3 is lower than the low potential voltage Vss, the OLED serving as the capacitor Coled accumulates charges through the driving TFT Td until a potential of the third node N3 is a value (Vref−Vth) obtained by subtracting the threshold voltage Vth of the driving TFT Td from the reference voltage Vref, that is, the output current Ids of the driving TFT Td is sufficiently small. As a result, the storage capacitor Cs stores a voltage (Vdata−Vref+Vth) corresponding to a difference between the data voltage Vdata supplied via the turned-on data TFT Tdata and the voltage (Vref-Vth) supplied to the third node N3, thereby storing the voltage (Vdata−Vref+Vth) corresponding to the data voltage Vdata in which the threshold voltage Vth is compensated.

During a light emitting period shown in FIG. 12, the merge TFT Tme is turned on in response to the gate-on voltage of the merge signal MSn supplied to the n-th merge line 34n. The driving TFT Td controls the source-drain current Ids in response to the voltage (Vdata−Vref+Vth) of the storage capacitor Cs supplied to the first node N1 through the turned-on merge TFT Tme, thereby driving the OLED to emit light.

Figure 13:
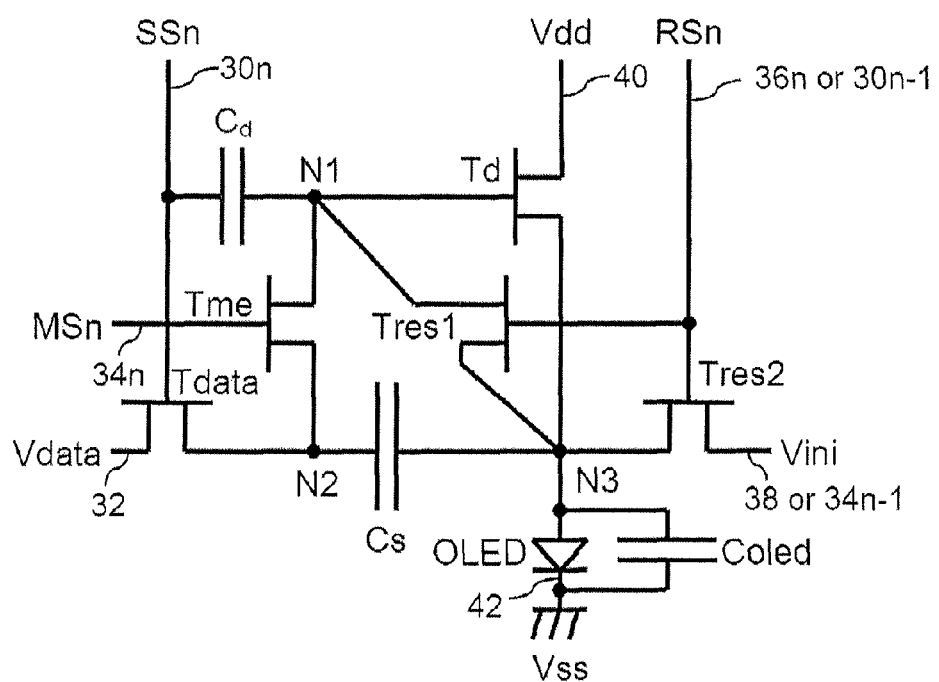
FIG. 13 is an equivalent circuit diagram of a pixel circuit of an AMOLED display device according to a sixth exemplary embodiment of the present invention.

FIG. 13 is an equivalent circuit diagram of a pixel circuit of an AMOLED display device according to a sixth exemplary embodiment of the present invention.

The pixel circuit of FIG. 13 according to the sixth embodiment is the same as the pixel circuit of FIG. 1 according to the first embodiment, except that a capacitor Cd is used instead of the reference TFT Tref and, therefore, description of parts which are identical to those of FIG. 1 will be omitted. The capacitor Cd is connected between the n-th scan line 30n and the first node N1. If the n-th scan signal SSn varies to the gate-on voltage Von from the gate-off voltage Voff during the program period shown in FIG. 2, a voltage of the first node N1 increases in proportion to the product of the varied voltage of the n-th scan signal and a ratio Cd/Ctotal of a capacitance of the capacitor Cd to a total capacitance Ctotal including a parasitic capacitance. Thus, during a program period, the capacitor Cd supplies a voltage similar to the reference voltage Vref to the first node N1, like the reference TFT Tref of FIG. 1, to drive the driving TFT Td until the source-drain current Ids of the driving TFT Td is sufficiently small, so that the threshold voltage Vth can be detected.

As described above, the voltage compensation type pixel circuit of the AMOLED display device according to the present invention detects the threshold voltage Vth using the OLED as the capacitor Coled without constructing the driving TFT Td as a diode structure during a program period. Therefore, a negative threshold voltage as well as a positive threshold voltage can be detected irrespective of n-type TFTs and p-type TFTs, and thus the threshold voltage Vth can be accurately detected in a variety of voltage ranges.

The voltage compensation type pixel circuit of the AMOLED display device according to the present invention uses a connection structure in which the driving TFT Td and the OLED are serially connected between the high-potential power line 40 and the low-potential power line 42 and uses the OLED as the capacitor Coled by applying a negative bias to the OLED during an initialization period and a program period. Accordingly, unnecessary luminance is prevented by emitting the OLED only during a light emitting period and thus contrast can be raised.

The voltage compensation type pixel circuit of the AMOLED display device according to the present invention causes the driving TFT Td to always operate in a saturation region during a light emitting period and thus TFT degradation caused by bias stress is small.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A voltage compensation type pixel circuit of an organic light emitting diode for driving a light emitting element, comprising:
    a driving transistor serially connected to the light emitting element between a high-potential power line and a low-potential power line to drive the light emitting element in response to a voltage supplied to a first node;
    a program transistor that supplies a data voltage of a data line to a second node in response to a scan signal of a scan line;
    a merge transistor that connects the first node and the second node in response to a merge signal of a merge line;
    a storage capacitor connected between a third node and the second node to store a voltage which corresponds to the data voltage in which the threshold voltage is compensated, wherein the third and second nodes are interposed between the driving transistor and the light emitting element;
    first and second reset transistors that initialize at least two of the first, second, and third nodes to an initialization voltage of an initialization voltage line in response to a reset signal of a reset line; and
    a capacitor connected between the scan line and the first node to supply a reference voltage to the first node according to variation of the scan signal.

2. The voltage compensation type pixel circuit of claim 1, wherein a negative bias is applied to the light emitting element during the initialization period and the program period to use the light emitting element as the capacitor, and a positive bias is applied to the light emitting element only during the light emitting period to drive the light emitting element.

3. The voltage compensation type pixel circuit of claim 2, wherein, during the program period, the capacitor of the light emitting element accumulates charges through the driving transistor until a potential of the third node reaches a voltage corresponding to a difference between the reference voltage and the threshold voltage, and the storage capacitor stores a voltage corresponding to a difference between voltages of the second and third nodes, and
    during the light emitting period, the driving transistor supplies current proportional to the square of a voltage (Vdata−Vref) corresponding to a difference between the data voltage and the reference voltage to the light emitting element.

4. The voltage compensation type pixel circuit of claim 2, wherein the transistors of the pixel circuit are n-type transistors and detect a positive threshold voltage or a negative threshold voltage during the program period.

5. The voltage compensation type pixel circuit of claim 2, wherein the transistors of the pixel circuit are p-type transistors and detect a positive threshold voltage or a negative threshold voltage during the program period.

6. The voltage compensation type pixel circuit of claim 2, wherein black luminance of the light emitting element is controlled by adjusting the reference voltage.

7. The voltage compensation type pixel circuit of claim 2, wherein the driving transistor is always driven in a saturation region.

* * * * *